US007728627B2

(12) United States Patent
Pike et al.

(10) Patent No.: US 7,728,627 B2
(45) Date of Patent: Jun. 1, 2010

(54) INTELLIGENT EMBEDDED POWER RAIL AND CONTROL SIGNAL SEQUENCER

(75) Inventors: Don Pike, Stittsville (CA); David Peppy, Ottawa (CA); John Madsen, Austin, TX (US)

(73) Assignee: Alcatel Lucent, Paris (FR)

( * ) Notice: Subject to any disclaimer, the term of this patent is extended or adjusted under 35 U.S.C. 154(b) by 0 days.

(21) Appl. No.: 12/204,139

(22) Filed: Sep. 4, 2008

(65) Prior Publication Data

US 2010/0052766 A1 Mar. 4, 2010

(51) Int. Cl.
*G06F 7/38* (2006.01)
(52) U.S. Cl. .............................. 326/46; 326/33; 326/39; 307/34; 307/38
(58) Field of Classification Search ................... 326/32, 326/33, 38, 39, 46; 307/18, 31–34, 38–41
See application file for complete search history.

(56) References Cited

U.S. PATENT DOCUMENTS

| 5,721,933 | A  | * | 2/1998  | Walsh et al. ................. 713/300 |
| 6,803,787 | B1 | * | 10/2004 | Wicker, Jr. ..................... 326/46 |
| 7,030,649 | B1 | * | 4/2006  | Balasubramanian et al. .. 326/38 |
| 7,560,952 | B2 | * | 7/2009  | Zhu et al. ...................... 326/38 |

* cited by examiner

*Primary Examiner*—James H. Cho
*Assistant Examiner*—Jason Crawford
(74) *Attorney, Agent, or Firm*—Kramer & Amado P.C.

(57) ABSTRACT

A power sequencing method may use a state machine in a programmable sequencer to program relative timing of signals to activate different power rails attached to an integrated circuit. Input lines may specify the sequencing program. Alternatively, the programmable sequencer may use an EEPROM or other computer-readable medium to program itself with a particular image of the sequencing program. The programmable sequencer may be implemented by a Field Programmable Gate Array (FPGA).

14 Claims, 5 Drawing Sheets

INTELLIGENT EMBEDDED POWER RAIL AND CONTROL SIGNAL SEQUENCER

BACKGROUND OF THE INVENTION

1. Field of the Invention

This invention relates generally to provision of power to a line card.

2. Description of the Related Art

Hardware-based line cards used in networking applications often include a variety of different Integrated Circuits (ICs), each of which receive power from one or more power lines known as power rails. As line cards increase in complexity, the number of ICs on each card is also increasing. To further complicate matters, each IC often has different power and control sequencing requirements. For example, each IC may be required to ramp up in a particular pattern with respect to other rails. Latch-up failures or excessive current draw could occur if sequencing goes awry.

Another significant design factor is the fact that these ICs often have sequencing requirements on certain control signals. For example, a first power rail might need to be stable before the second power rail. As another example, a first power rail and all clocks might need to be stable before a second power rail is activated. As another example, a reset signal may need to be asserted for a fixed amount of time after a certain power rail is stable.

Hardware engineers must often manually implement discrete circuits to meet the sequencing requirements. This is not only a time-consuming process, but results in significant inefficiencies, as the hardware engineer must redesign a new circuit whenever the components of the line card change. As a result of these inefficiencies, the current process for addressing power requirements of line cards is very expensive.

Accordingly, there is a need for a system and method that enable efficient implementation of power rail sequencing. There is a further need for an inexpensive, programmable sequencer that dynamically responds to various power rail environments.

SUMMARY OF THE INVENTION

In light of the present need for improved power rail sequencing, a brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

In various exemplary embodiments, an apparatus may comprise a programmable sequencer that receives stimulus signals and produces control signals; a plurality of power rails that receive control signals from the programmable sequencer; and at least one input line that supplies stimulus signals to the programmable sequencer; wherein the programmable sequencer generates control signals that initialize the power rails in a particular order, the particular order specified by the stimulus signals.

In various exemplary embodiments, the programmable sequencer may be a complex programmable logic device (CPLD) or a Field Programmable Gate Array (FPGA). At least one input line may be selected from the group consisting of processor identification lines, memory type lines, and jumper lines. The stimulus signals may provide an input sequencing program to the programmable sequencer. At least one processor may receive control signals from the programmable sequencer.

In various exemplary embodiments, an apparatus may comprise a programmable sequencer that receives stimulus signals and produces control signals; a plurality of power rails that receive control signals from the programmable sequencer; and an EEPROM that supplies an image of a sequencing program to the programmable sequencer; wherein the programmable sequencer generates control signals that initialize the power rails in a particular order, the particular order specified by the sequencing program. The EEPROM may be a flash EEPROM. The programmable sequencer may be a complex programmable logic device (CPLD) or a Field Programmable Gate Array (FPGA).

In various exemplary embodiments, a power sequencing method may comprise the following steps: loading instructions into a programmable sequencer; sending a first control signal from the programmable sequencer to activate a first power rail; and sending a second control signal from the programmable sequencer to activate a second power rail; wherein the instructions specify a time difference between the first control signal and the second control signal.

In various exemplary embodiments, the time difference between the first control signal and the second control signal may be 3 ms. The method may further comprise the following steps: trimming a voltage of the first power rail after activating the first power rail; and trimming a voltage of the second power rail after activating the second power rail. The method may further comprise the following step: ending a reset mode after sending the second control signal. The reset mode may end 500 µs after the second control signal is sent.

The preceding objects and advantages of the invention are illustrative of those that can be achieved by the various exemplary embodiments and are not intended to be exhaustive or limiting of the possible advantages which can be realized. Thus, these and other objects and advantages of the various exemplary embodiments will be apparent from the description herein or can be learned from practicing the various exemplary embodiments, both as embodied herein or as modified in view of any variation that may be apparent to those skilled in the art. Accordingly, the present invention resides in the novel methods, arrangements, combinations, and improvements herein shown and described in various exemplary embodiments.

BRIEF DESCRIPTION OF THE DRAWINGS

In order to better understand various exemplary embodiments, reference is made to the accompanying drawings, wherein.

DETAILED DESCRIPTION OF THE PREFERRED EMBODIMENTS OF THE INVENTION

Figure 1:
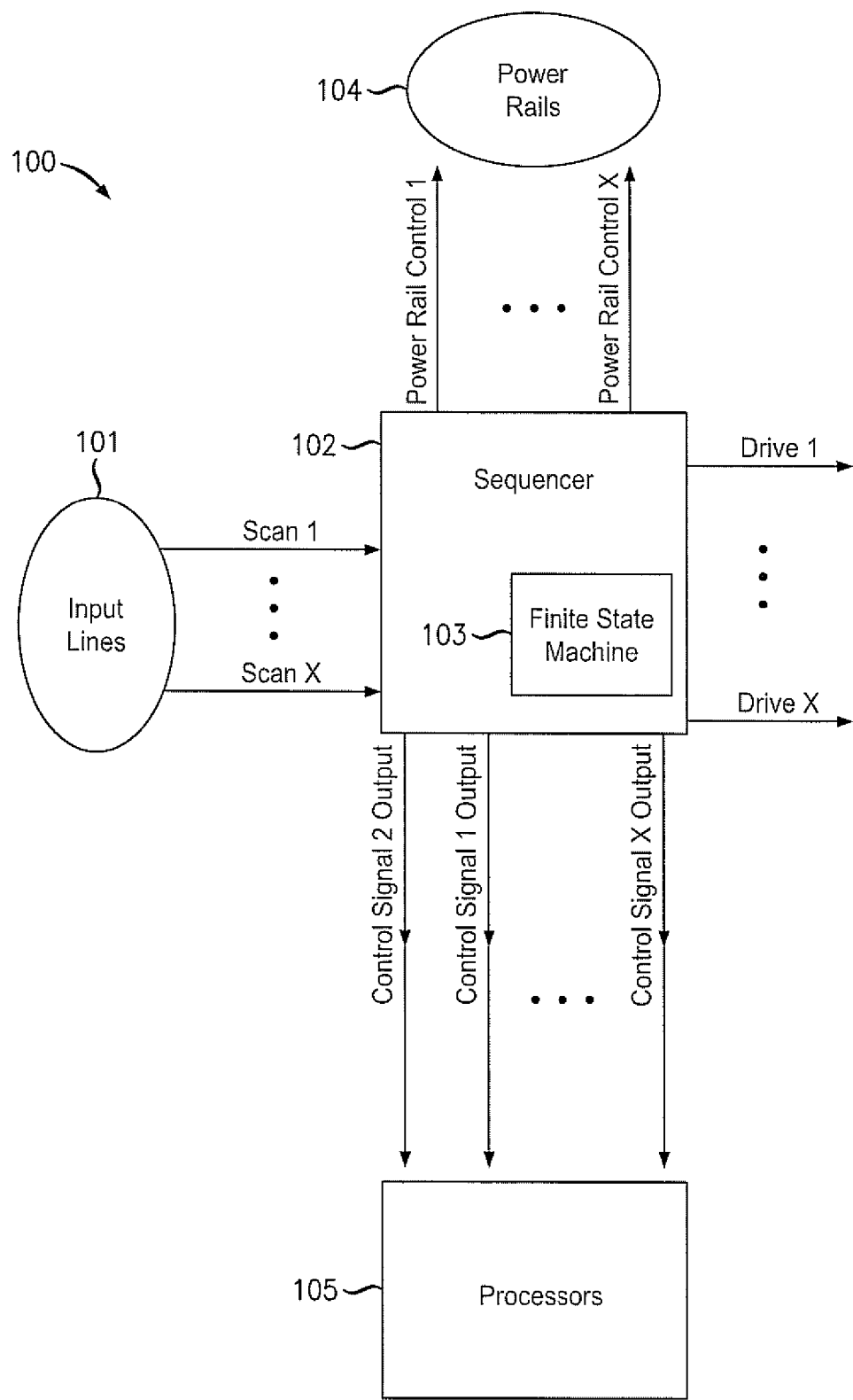
FIG. 1 depicts a first exemplary device for power rail and control signal sequencing.

Referring now to the drawings, in which like numerals refer to like components or steps, there are disclosed broad aspects of various exemplary embodiments.

FIG. 1 depicts a first exemplary device 100 for power rail and control signal sequencing. Device 100 comprises at least one input line 101 coupled to a programmable sequencer 102. Input line 101 may be a board input line, such as a processor identification (ID) line, a memory type line, a jumper line, or any other mechanism for providing signals to sequencer 102. Line 101 may provide a plurality of stimulus signals as a sequencing program to sequencer 102. Thus, input line 101 is user-configurable, such that a customized power rail and control signal sequence may be sent to sequencer 102.

Sequencer 102 may be a programmable logic device, such as a Field Programmable Gate Array (FPGA). FPGAs are semiconductor devices that comprise logic blocks and lines connecting those logic blocks that a user or computer may program to change the functionality of the FPGA. Sequencer 102 may comprise a finite state machine 103 that carries out the functions found within the input sequencing program. In particular, finite state machine 103 may include a plurality of flip-flops configured to switch between portions of logic in sequencer 102. State machine 103 is described further below with reference to FIG. 2.

In operation, sequencer 102 provides programmable timing for both power rails 104 and processors 105 based on the logic received from input lines 101. Thus, sequencer 102 sends a plurality of power rail control signals to power rails 104, thereby powering each IC connected to the corresponding power rails 104. Furthermore, sequencer 102 sends a plurality of control signals to at least one processor 105. Processor 105 may be, for example, a network service processor that allows for Open Systems Interconnection (OSI) processing. It should be apparent, however, that any type of processor known to those of skill in the art may be used for processor 105.

It should be apparent from the description above that device 100 provides significant benefits to hardware designers. In particular, an engineer may program input lines 101 to send particular stimulus signals to sequencer 102, without necessitating modification of the underlying circuitry. Thus, when designing or modifying a line card or other piece of hardware, an engineer may quickly address power rail and control sequencing concerns, without the need to design a customized circuit. Furthermore, because line cards frequently include an FPGA, no additional hardware is necessary to accomplish this functionality.

Figure 2:
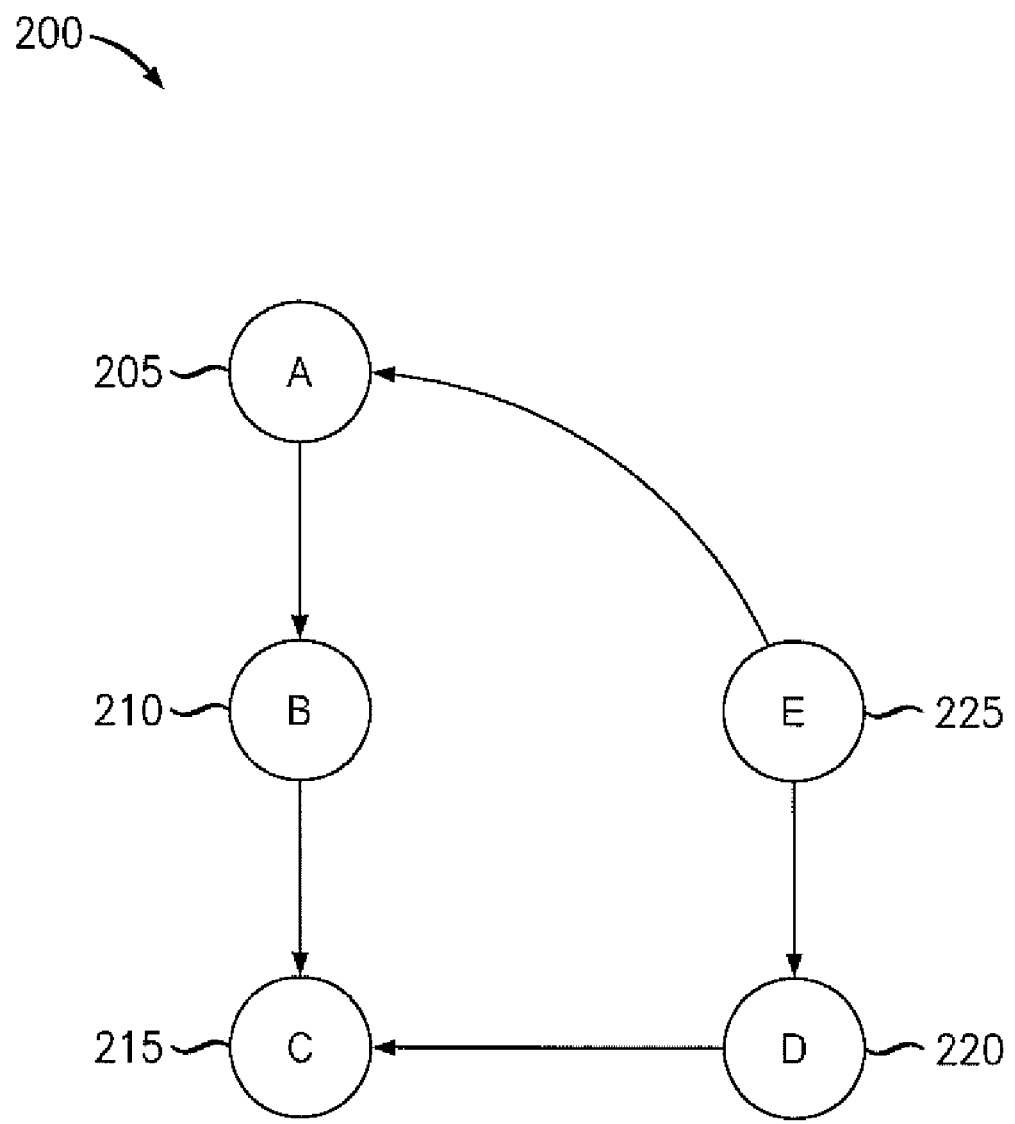
FIG. 2 depicts a state diagram for a finite state machine used to implement power rail and control signal sequencing.

FIG. 2 depicts an exemplary state diagram 200 for a finite state machine 103 used to implement power rail and control signal sequencing. Diagram 200 illustrates five states for the finite state machine, such as finite state machine 103 of FIG. 1. Thus, this state machine may be used in a FPGA that implements sequencer 102 of FIG. 1.

When sequencer initially starts up, the IC is in reset. In state A 205, logic on the sequencer 102 is triggered to apply a first voltage level to the power rails. In state B 210, logic on the sequencer 102 is triggered to trim the first voltage and pause based upon an input scan point. In state C 215, logic is triggered to apply a second voltage level to the power rails. In state D 220, logic is triggered to trim the second voltage and pause based upon an input scan point. Finally, in state E, logic is triggered to bring the IC out of reset. The FPGA may then complete a loop by transitioning from state E 225 back to state A 205.

It should be apparent that, although shown as including five states, state machine 103 may include any number of states. Furthermore, the functionality and order of each state may be modified based on the particular requirements of a given line card or other piece of hardware. Such modifications will be apparent to those of skill in the art.

Figure 3:
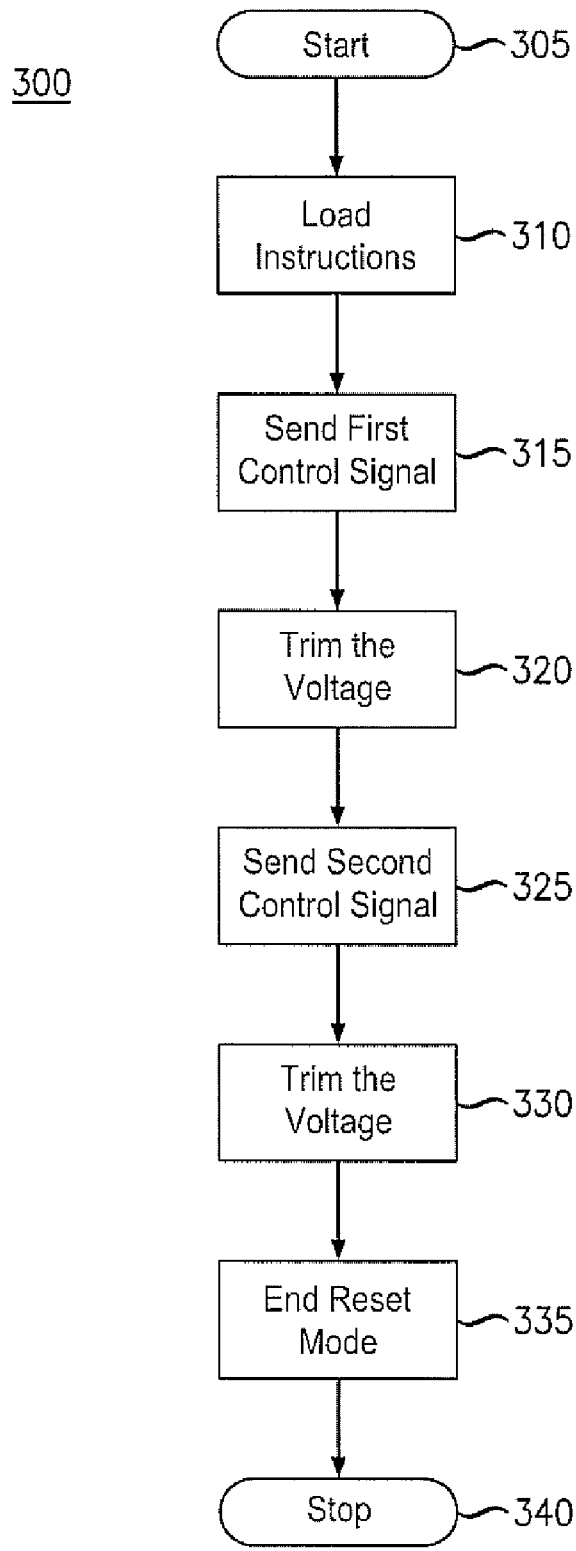
FIG. 3 depicts a method for power rail and control sequencing.

FIG. 3 depicts a method 300 for power rail and control sequencing. Method 300 starts in step 305. In step 310, the programmable sequencer receives instructions regarding sequencing. In various exemplary embodiments, the sequencer receives these instructions via an input line connected to the sequencer. Alternatively, the sequencer may retrieve these instructions from a computer-readable storage medium such as a flash memory drive, Random Access Memory (RAM), a hard drive, or any suitable storage medium known to those of skill in the art.

In step 310, the programmable sequencer starts its operation while the attached integrated circuit (IC) is in reset mode. The IC should be placed in reset mode because problems can occur if an improper voltage is applied while the IC is active. Thus, the IC should remain in reset mode until all sequencing operations are complete.

In step 315, the state machine in the programmable sequencer transitions to running state A. A first control signal specifies that a given power rail should output the voltage specified in the received instructions. Accordingly, the IC attached to the given power rail will receive the voltage amount required for its proper operation. Thus, an example, the control signal may instruct the power rail to output 1.8 volts to a first IC on the line card.

In step 320, the state machine transitions to state B. This step involves trimming of the voltage. In this trimming step, the level of the voltage is adjusted to closely coincide with the level specified by the first control signal. There may be a brief pause based upon a scan point, a point that indicates when a voltage application step should end.

In step 325, the state machine proceeds to state C. A second control signal specifies a second voltage level to the IC. In response, the IC may, for example, receive 3.3 volts, a higher potential than during step 315. Application of voltage to the IC should be timed. For example, the first power rail may be activated 3 ms before the second power rail.

In step 330, the state machine continues to step D. This step involves additional trimming of the voltage. In this trimming step, the level of the voltage is adjusted to closely coincide with the level specified by the second control signal. There may be another brief pause based upon a scan point, a point that indicates when this voltage application step should end.

In step 335, the procedure takes the IC out of the reset mode. A normal boot-up sequence for the system may now occur. The state machine is now in state E and ready to return to state A. The relative timing between the issuance of the second control signal and the end of the reset mode should be set. For example, the end of the reset mode may occur 500 μs after issuance of the second control signal. Method 300 stops in step 340.

Figure 4:
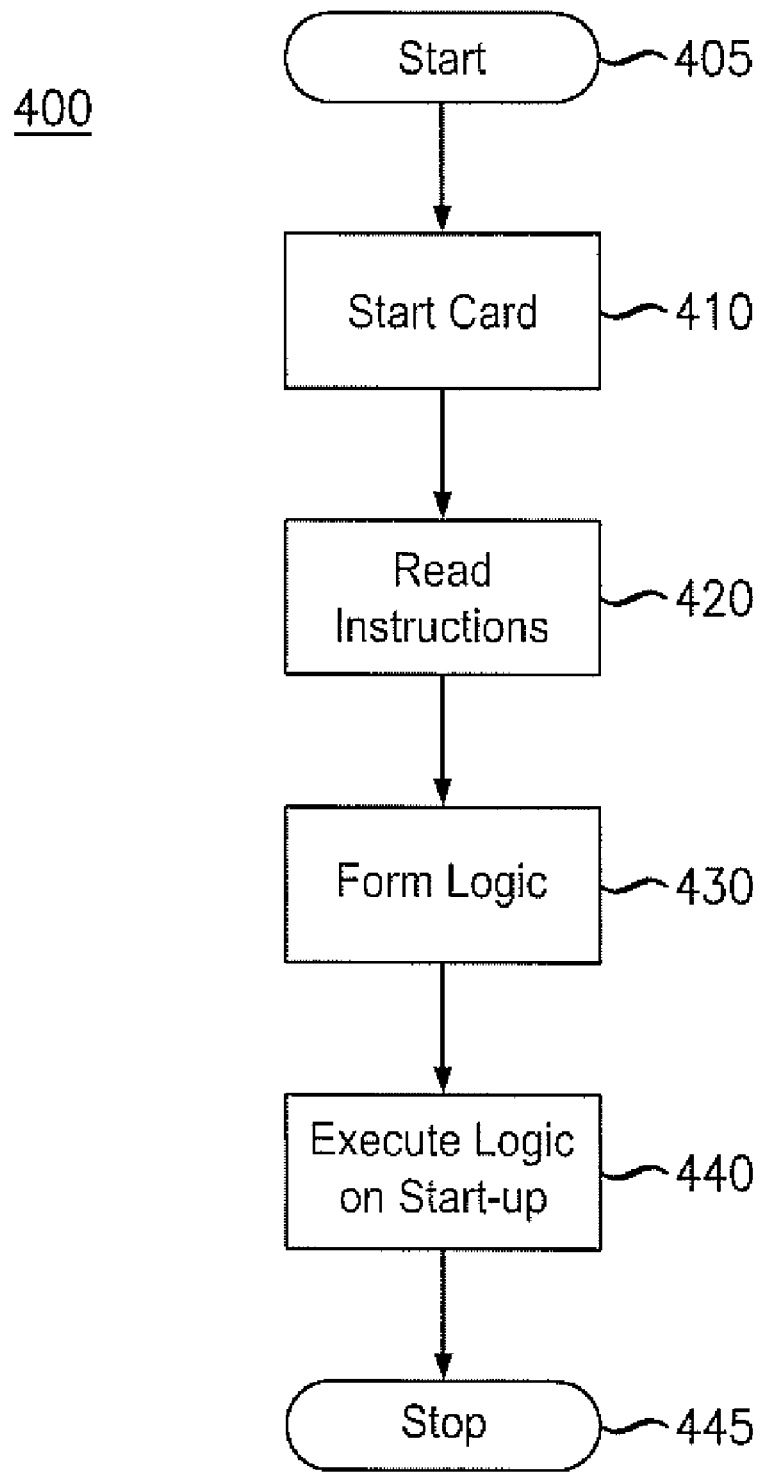
FIG. 4 depicts a method for executing logic on a programmable sequencer.

FIG. 4 depicts a procedure 400 for executing logic on a programmable sequencer.

Procedure 400 starts in step 405. In step 410, procedure 400 starts the card. This may occur when a programmable logic device, such as a Field Programmable Gate Array (FPGA), on the card is activated. Next, in step 420, the system reads instructions from a suitable computer readable medium. These instructions may specify appropriate voltage levels for particular rails attached to the programmable sequencer. Procedure 400 then proceeds to form logic, applying an input program to the programmable logic device or FPGA, in step 430. In step 440, this logic is executed upon start-up of the computer system, thereby providing proper voltage levels to each rail prior to a normal boot-up sequence. Procedure 400 ends in step 445.

As will be appreciated by one of skill in the art, sequencing may be implemented in a number of ways. As a first alternative, the sequencer could dynamically sample hardware scan points and configuration records for attached devices to control inputs of other processors during the bring-up phase of those processors. As another alternative, the device could control the sequence of power rails to other devices. For example, it could control some kind of "on" signal to the power rail generator. As yet another alternative, the device could control sequencing of key control signals to other devices. As a further alternative, the device could also have part of the sequencing, such as resets to some of the processors, under software control as opposed to using a hardware based sequencer.

Figure 5:
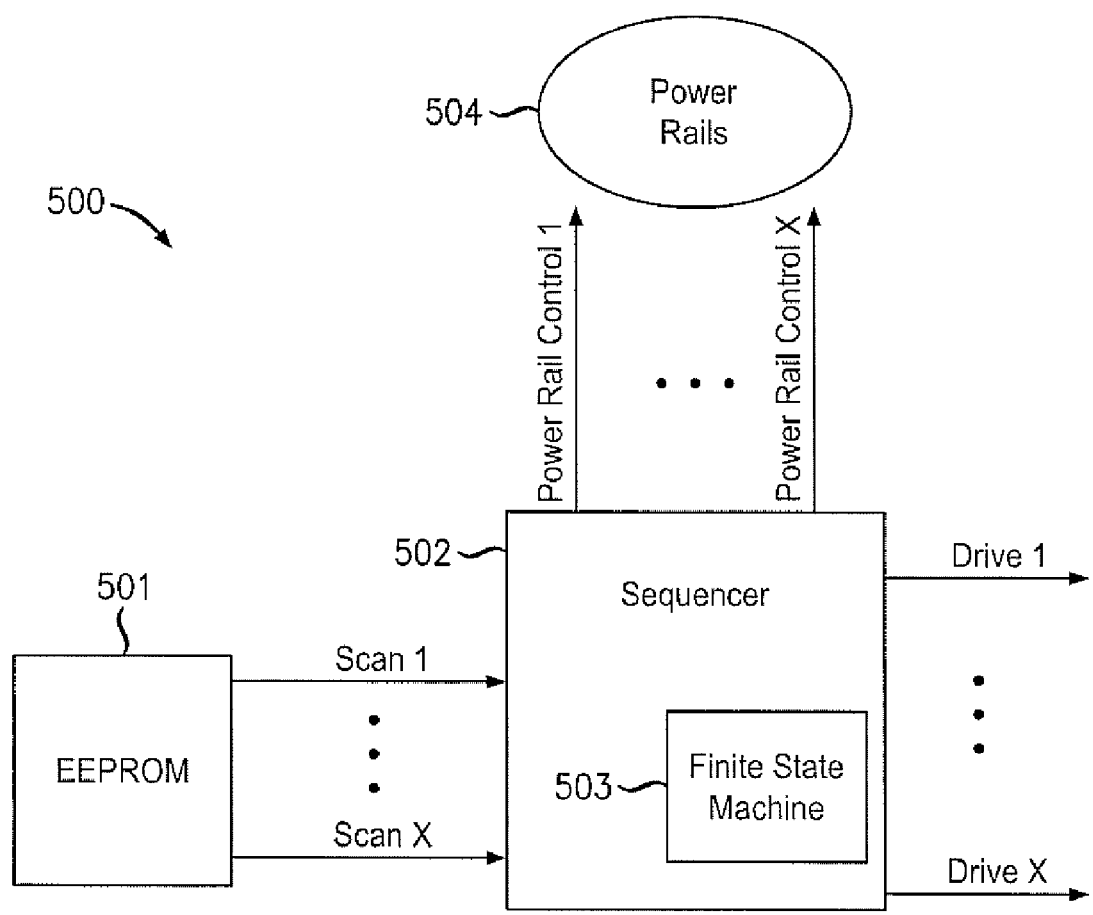
FIG. 5 depicts a second exemplary device for power rail and control signal sequencing.

FIG. 5 depicts another device 500 for sequencing control signals. Device 500 resembles device 100 but uses an EEPROM 501 instead of input lines 101. Sequencer 502 and power rails 503 respectively resemble sequencer 102 and power rails 103 of FIG. 1. Sequencer 502 may be a programmable logic device, such as an FPGA or a suitable equivalent that can be programmed by EEPROM 501. Sequencer 502 may internally comprise a finite state machine 503.

EEPROM 501 is an Electrically Erasable Programmable Read-Only Memory (EEPROM), a non-volatile memory that can temporarily store data for configuring a device. When large amounts of static data need to be stored, it may be economical to use a flash EEPROM, a specific type of EEPROM that has erase circuits shared by large blocks of cells.

Rather than using input lines 101 as in FIG. 1, device 500 has sequencer 502 program itself by reading EEPROM 501. EEPROM 501 may store multiple loads, wherein each load corresponds to a particular configuration of power rails 504. Thus, device 500 may use logic within EEPROM 501 to select one load that includes an image of the proper sequence for applying power to power rails 504. Thus, the image from EEPROM 501 will be loaded onto sequencer 502, directly transferring a sequencing program to sequencer 502 without the need of any intervention by a user.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the preceding disclosure, description, and figures are for illustrative purposes only and do not in any way limit the invention, which is defined only by the claims.

What is claimed is:

1. An apparatus comprising:
    a programmable sequencer that receives an image of a sequencing program and produces control signals;
    a plurality of power rails that receive control signals from said programmable sequencer; and
    an EEPROM that stores multiple loads, wherein each load corresponds to a particular configuration of the power rails and selecting one of the multiple loads applies a corresponding image of the sequencing program to the programmable sequencer, thereby transferring the sequencing program to the programmable sequencer without any intervention by a user,
    wherein said programmable sequencer generates the control signals to initialize said power rails in a particular order, said particular order specified by said sequencing program.

2. The apparatus of claim 1, wherein said EEPROM is a flash EEPROM.

3. The apparatus of claim 1, wherein said programmable sequencer is a programmable logic device.

4. The apparatus of claim 1, wherein said programmable sequencer is a Field Programmable Gate Array (FPGA).

5. The apparatus of claim 1, wherein said programmable sequencer uses a finite state machine.

6. The apparatus of claim 1, further comprising:
    at least one processor that receives control signals from said programmable sequencer.

7. A power sequencing method comprising the following steps:
    selecting a load from an EEPROM that stores multiple loads, wherein each load corresponds to a particular configuration of a first power rail and a second power rail;
    loading instructions from the selected load into a programmable sequencer, thereby transferring the sequencing program to the programmable sequencer without any intervention by a user;
    sending a first control signal from said programmable sequencer to activate the first power rail; and
    sending a second control signal from said programmable sequencer to activate the second power rail, wherein said instructions specify a time difference between said first control signal and said second control signal.

8. The method of claim 7, wherein said time difference between said first control signal and said second control signal is 3 ms.

9. The method of claim 7, further comprising the following steps:
    trimming a voltage of said first power rail after activating said first power rail; and
    trimming a voltage of said second power rail after activating said second power rail.

10. The method of claim 7, further comprising the following step:
    ending a reset mode after sending said second control signal.

11. The method of claim 10, wherein said reset mode ends 500 μs after said second control signal is sent.

12. The method of claim 7, wherein said programmable sequencer is a programmable logic device.

13. The method of claim 7, wherein said programmable sequencer is a Field Programmable Gate Array (FPGA).

14. The method of claim 7, wherein said programmable sequencer uses a finite state machine.

* * * * *